United States Patent
Kim et al.

(10) Patent No.: US 10,147,723 B2
(45) Date of Patent: Dec. 4, 2018

(54) SEMICONDUCTOR DEVICES HAVING BRIDGE LAYER AND METHODS OF MANUFACTURING THE SAME

(71) Applicant: Samsung Electronics Co., Ltd., Suwon-si, Gyeonggi-do (KR)

(72) Inventors: Seok-Hoon Kim, Suwon-si (KR); Jin-Bum Kim, Seoul (KR); Kwan-Heum Lee, Suwon-si (KR); Byeong-Chan Lee, Yongin-si (KR); Cho-Eun Lee, Pocheon-si (KR); Jin-Hee Han, Ansan-si (KR); Bon-Young Koo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/653,733

(22) Filed: Jul. 19, 2017

(65) Prior Publication Data
US 2017/0317081 A1    Nov. 2, 2017

Related U.S. Application Data

(63) Continuation of application No. 15/177,421, filed on Jun. 9, 2016, now Pat. No. 9,735,158, which is a (Continued)

(30) Foreign Application Priority Data

May 13, 2014    (KR) .................. 10-2014-0057209

(51) Int. Cl.
| | |
|---|---|
| *H01L 27/088* | (2006.01) |
| *H01L 27/02* | (2006.01) |
| *H01L 29/78* | (2006.01) |
| *H01L 27/11* | (2006.01) |
| *H01L 21/8234* | (2006.01) |
| *H01L 27/092* | (2006.01) |
| *H01L 29/06* | (2006.01) |
| *H01L 29/417* | (2006.01) |

(52) U.S. Cl.
CPC .. *H01L 27/0886* (2013.01); *H01L 21/823431* (2013.01); *H01L 27/0207* (2013.01); *H01L 27/0924* (2013.01); *H01L 27/1104* (2013.01); *H01L 29/0649* (2013.01); *H01L 29/41791* (2013.01); *H01L 29/78* (2013.01); *H01L 29/785* (2013.01); *H01L 29/7842* (2013.01); *H01L 29/7849* (2013.01); *H01L 21/823475* (2013.01)

(58) Field of Classification Search
CPC .......... H01L 21/823431; H01L 21/845; H01L 27/0886; H01L 27/0924
See application file for complete search history.

(56) References Cited

U.S. PATENT DOCUMENTS

| | | |
|---|---|---|
| 8,263,451 B2 | 9/2012 | Su et al. |
| 8,362,575 B2 | 1/2013 | Kwok et al. |

(Continued)

*Primary Examiner* — Elias M Ullah
(74) *Attorney, Agent, or Firm* — Myers Bigel, P.A.

(57) ABSTRACT

A semiconductor device includes a substrate, a first active fin and a second active fin on the substrate, respectively, a plurality of first epitaxial layers on the first active fin and on the second active fin, respectively, a plurality of second epitaxial layers on the plurality of first epitaxial layers, a bridge layer connecting the plurality of second epitaxial layers to each other, and a third epitaxial layer on the bridge layer.

20 Claims, 26 Drawing Sheets

Related U.S. Application Data continuation of application No. 14/576,368, filed on Dec. 19, 2014, now Pat. No. 9,368,495.

(56) References Cited

U.S. PATENT DOCUMENTS

| | | |
|---|---|---|
| 8,399,938 B2 | 3/2013 | Cheng et al. |
| 8,440,517 B2 | 5/2013 | Lin et al. |
| 8,809,131 B2 | 8/2014 | Bangsaruntip |
| 2011/0298058 A1 | 12/2011 | Kawasaki et al. |
| 2012/0138886 A1 | 6/2012 | Kuhn et al. |
| 2013/0043536 A1 | 2/2013 | Rahim et al. |
| 2013/0049068 A1 | 2/2013 | Lin et al. |
| 2013/0187206 A1 | 7/2013 | Mor et al. |
| 2014/0021538 A1 | 1/2014 | Bangsaruntip |
| 2015/0035023 A1* | 2/2015 | Kim .................... H01L 29/785 257/288 |

* cited by examiner

SEMICONDUCTOR DEVICES HAVING BRIDGE LAYER AND METHODS OF MANUFACTURING THE SAME

CROSS-REFERENCE TO RELATED APPLICATIONS

This U.S. non-provisional patent application claims priority as a continuation application of U.S. patent application Ser. No. 15/177,421, filed Jun. 9, 2016 which is a continuation of U.S. patent application Ser. No. 14/576,368, filed Dec. 19, 2014, which in turn claims priority under 35 U.S.C. § 119 to Korean Patent Application No. 10-2014-0057209 filed on May 13, 2014 in the Korean Intellectual Property Office (KIPO), the contents of which are herein incorporated by reference in their entirety.

BACKGROUND

In order to provide semiconductor devices with a more rapid operational speed and increased integration degree, a channel length of a MOS field effect transistor (MOSFET) has been gradually reduced. However, this may cause a short channel effect.

Therefore, a fin-type field effect transistor (FinFET) having a three dimensional channel region may be of increasing interest in the semiconductor business because it may reduce the short channel effect and may increase drive current of the MOSFET at a low operation voltage.

Some research has been conducted on the use of an epitaxial layer having a tensile or compressive stress in the semiconductor devices to increase carrier mobility in a channel region of the MOSFET.

SUMMARY

Some embodiments of the present inventive concepts provide semiconductor devices having a bridge layer and methods of manufacturing the same.

In some embodiments, a semiconductor device may include a substrate, a first active fin and a second active fin on the substrate, respectively, a first epitaxial layer on the first active fin, a second epitaxial layer on the second active fin, a bridge layer connecting the first epitaxial layer to the second epitaxial layer, and a third epitaxial layer on the bridge layer.

Some embodiments provide that each of the first through the third epitaxial layers may have a flat upper surface, respectively. In some embodiments, the upper surfaces of the first through the third epitaxial layers may be disposed on substantially the same plane. Some embodiments provide that the third epitaxial layer may be disposed between the first epitaxial layer and the second epitaxial layer. The bridge layer may have a different germanium (Ge) concentration from those of the first through the third epitaxial layers. The bridge layer may comprise boron (B), and the first through the third epitaxial layers may comprise germanium (Ge).

In some embodiments, the semiconductor device may further include a capping layer between the first epitaxial layer and the third epitaxial layer and between the second epitaxial layer and the third epitaxial layer, respectively. The bridge layer and the capping layer may be composed of substantially the same material.

In some embodiments, the semiconductor device may include a substrate, a plurality of active fins on the substrate, a bridge layer connecting the plurality of active fins to each other, an epitaxial layer on the bridge layer, and a contact on the plurality of active fins and on the epitaxial layer.

Some embodiments provide that the epitaxial layer may be disposed between each of the plurality of active fins. In some embodiments, the contact may be connected to the plurality of active fins and to the epitaxial layer, simultaneously. Some embodiments provide that ones of the plurality of active fins and the epitaxial layer may have a flat upper surface, respectively. In some embodiments, the plurality of active fins and the epitaxial layer may be composed of substantially the same material.

Some embodiments provide that the semiconductor device may further include a capping layer between the plurality of active fins and the epitaxial layer. In some embodiments, the bridge layer and the capping layer may be composed of substantially the same material.

In some embodiments, the semiconductor device may include a substrate, a plurality of active fins protruding from the substrate and having a p-type impurity, a bridge layer connecting the plurality of active fins to each other, an epitaxial layer on the bridge layer, and a contact on the plurality of active fins and on the epitaxial layer. The bridge layer may be disposed between the plurality of active fins.

In some embodiments, ones of the plurality of active fins and the epitaxial layer may have a flat upper surface, respectively. Some embodiments provide that the plurality of active fins and the epitaxial layer may be composed of substantially the same material. In some embodiments, the semiconductor device may further include a capping layer between the plurality of active fins and the epitaxial layer. Some embodiments provide that the bridge layer and the capping layer may be composed of substantially the same material.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The foregoing and other features and advantages of this disclosure will be apparent from the more particular description of the example embodiments, as illustrated in the accompanying drawings in which like reference characters refer to the same parts throughout the different views. The drawings are not necessarily to scale, emphasis instead being placed upon illustrating the principles of the disclosed embodiments.

DETAILED DESCRIPTION

Figure 1:
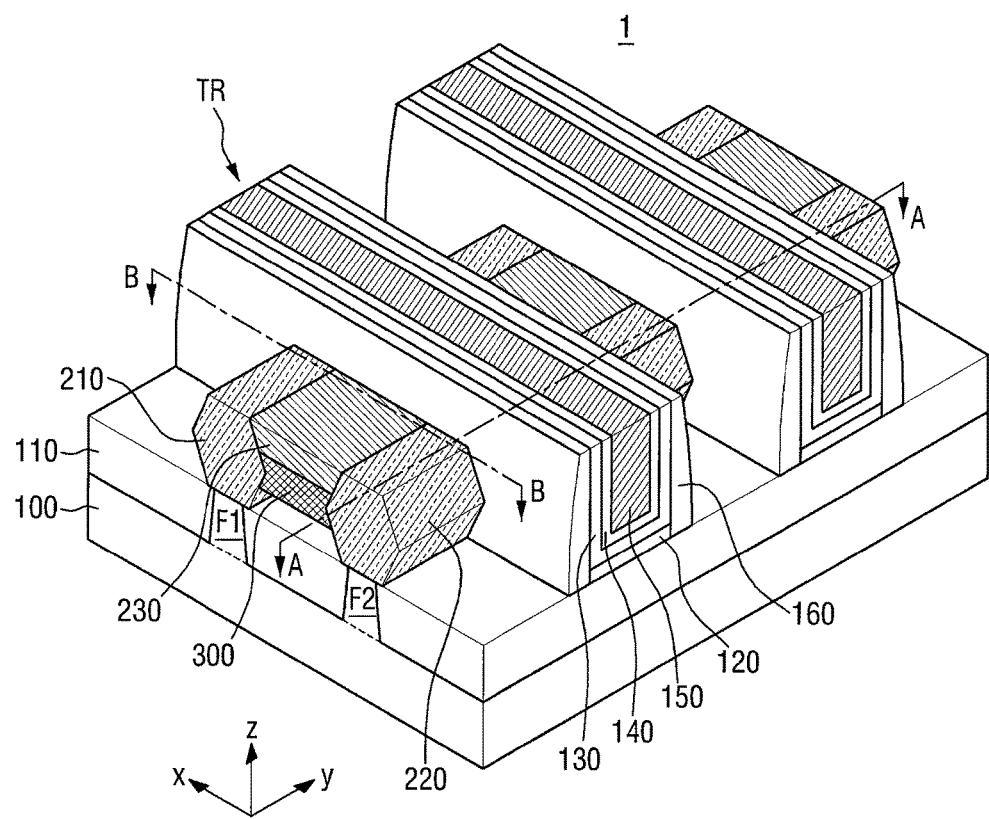
FIG. 1 is a perspective view illustrating a semiconductor device according to some embodiments of the inventive concepts.

Example embodiments of the inventive concepts will now be described more fully hereinafter with reference to the accompanying drawings; however, they may be embodied in different forms and should not be construed as limited to the exemplary embodiments set forth herein.

It will be understood that when an element is referred to as being "on," "connected" or "coupled" to another element, it can be directly on, connected or coupled to the other element or intervening elements may be present. In contrast, when an element is referred to as "contacting," or being "directly on," "directly connected" or "directly coupled" to another element, there are no intervening elements present. Other words used to describe the relationship between elements or layers should be interpreted in a like fashion (e.g., "between" versus "directly between," "adjacent" versus "directly adjacent," "under" versus "directly under").

It will be understood that, although the terms "first", "second", etc., may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below could be termed a second element, component, region, layer or section without departing from the teachings of example embodiments.

In the figures, the dimensions of layers and regions may be exaggerated for clarity of illustration.

Spatially relative terms, e.g., "beneath," "below," "lower," "above," "upper" and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the term "and/or" includes any and all combinations of one or more of the associated listed items. The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted.

Unless defined otherwise, all technical and scientific terms used herein have the same meaning as commonly understood by one of ordinary skill in the art. It is noted that the use of any and all examples, or exemplary terms provided herein is intended merely to better illuminate the example embodiments and is not a limitation on the scope of the inventive concepts unless otherwise specified.

Example embodiments will be described with reference to perspective views, cross-sectional views, and/or plan views. The profile of an example view may be modified according to, e.g., manufacturing techniques and/or allowances. Accordingly, the example embodiments are not intended to limit the scope, but cover all changes and modifications that can be caused due to, e.g., a change in manufacturing process. Thus, regions shown in the drawings are illustrated in schematic form and the shapes of the region are presented simply by way of illustration and not as a limitation.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, example embodiments of the inventive concepts will be described in detail with reference to the accompanying drawings.

Figure 2:
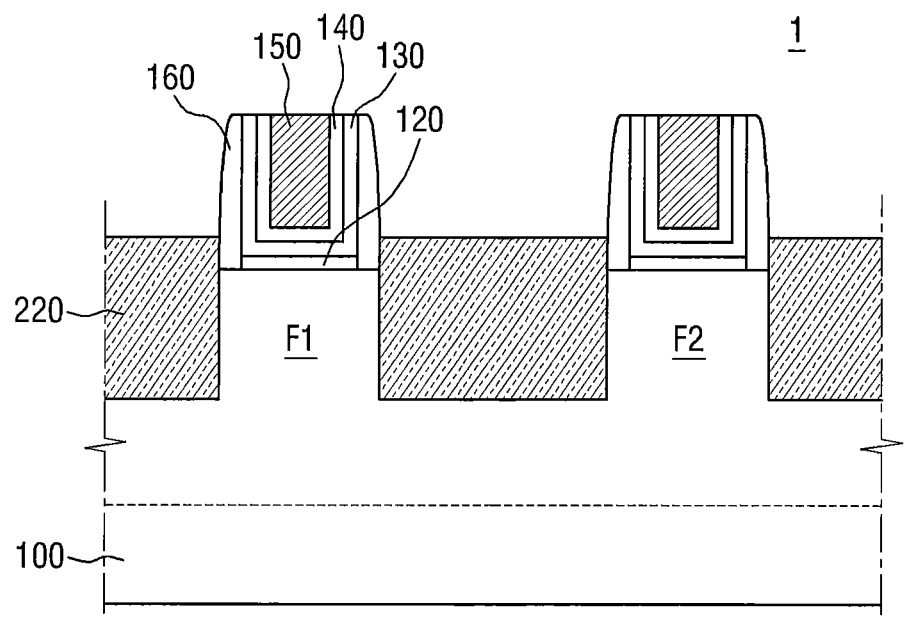
FIG. 2 is a cross-sectional view corresponding to line A-A of FIG. 1.
Figure 3:
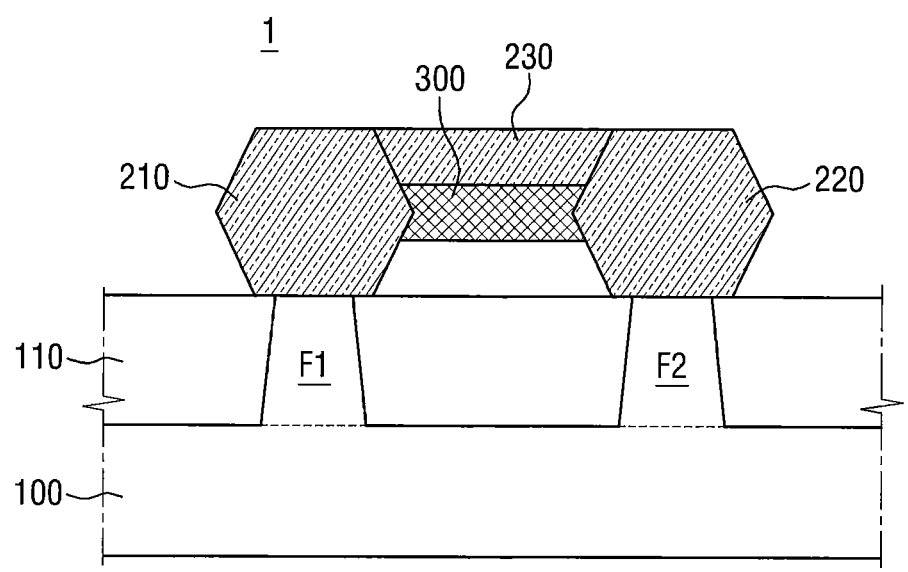
FIG. 3 is a cross-sectional view corresponding to line B-B of FIG. 1.

FIG. 1 is a perspective view illustrating a semiconductor device according to some embodiments of the inventive concepts. FIG. 2 is a cross-sectional view corresponding to line A-A of FIG. 1. FIG. 3 is a cross-sectional view corresponding to line B-B of FIG. 1.

Referring to FIGS. 1 through 3, a semiconductor device 1 according to some embodiments of the inventive concepts may include a substrate 100, a device isolation region 110, a first active fins F1, a second active fin F2, a gate structure TR, a first epitaxial layer 210, a second epitaxial layer 220, a bridge layer 300, and a third epitaxial layer 230.

The substrate 100 may comprise a bulk silicon substrate or a silicon-on-insulator (SOI) substrate. For example, the substrate 100 may be a rigid substrate including silicon (Si), silicon germanium (SiGe), or glass which may be used in display panel. In some embodiments, the substrate 100 may be a flexible substrate including polyimide, polyester, polycarbonate, polyethersulfone, polymethylmethacrylate, polyethylenenaphthalate, and/or polyethyleneterephthalate.

The substrate 100 may have a first region I and a second region II. The first region I and the second region II may be separated by a device isolation region 110, e.g., shallow trench isolation (STI). The first region I may be a PMOS region and the second region II may be an NMOS region, however, it shall not be restricted or limited thereto.

Hereinafter, it will be described that the substrate 100 is a PMOS region for convenience of description.

The device isolation region 110 may include a high-density-plasma (HDP) oxide layer, a silicon-on-glass (SOG) oxide layer, and/or a chemical-vapor-deposition (CVD) oxide layer.

The first active fin F1 and the second active fin F2 may be formed on the substrate 100. The first active fin F1 and the second active fin F2 may have a shape of protruding from the substrate 100. The first and second active fins F1 and F2 may be a part of the substrate 100 or formed by using at least one step of epitaxial processes.

The first and second active fins F1 and F2 may extend to a second direction (Y-axis direction). The device isolation region 110 may be formed on the substrate 100 and may cover a lower portion of sidewalls of the first and second active fins F1 and F2.

A gate structure TR may be formed on the first and second active fins F1 and F2. The gate structure TR may cross the first and second active fins F1 and F2 and may extend to a first direction (X-axis direction).

The gate structure TR may include an interface layer 120, a gate dielectric layer 130, a work-function control layer 140, a gate metal 150, and a gate spacer 160, which are sequentially formed on the substrate 100. Therefore, a channel region may be formed not only on upper surfaces but also sidewalls of the first active fin F1 and the second active fin F2, respectively.

The interface layer 120 may be formed on the device isolation region 110 and on the first and second active fins F1 and F2. The interface layer 120 may reduce some problems, for example, adhesion properties induced by different coefficient of thermal expansion, between the device isolation region 110 and the gate dielectric layer 130.

The interface layer 120 may be formed of an insulating layer, for example, at least one of silicon oxide layer, silicon oxynitride layer, a silicate layer, or mixture thereof, having a low dielectric constant. The dielectric constant of the interface layer 120 may be less than 9.

The gate dielectric layer 130 may be formed on the interface layer 120. If the interface layer 120 is omitted, the gate dielectric layer 130 may be formed on the first and second active fins F1 and F2 and on the device isolation region 110.

The gate dielectric layer 130 may include a high-k material, for example, at least one of hafnium silicon oxynitride (HfSiON), hafnium oxide (HfO$_2$), zirconium oxide (ZrO$_2$), tantalum oxide (Ta$_2$O$_5$), titanium oxide (TiO$_2$), strontium titanate (SrTiO$_3$), and/or barium titanate (BaTiO$_3$).

Thickness of the gate dielectric layer 130 may be changed according to the kind thereof. For example, if the gate dielectric layer 130 is a hafnium oxide (HfO$_2$), the thickness thereof may be from 0.5 nm to 5 nm. The gate dielectric layer may be formed along the sidewall of the gate spacer 160.

The work-function control layer 140 may be formed on the gate dielectric layer 130. The work-function control layer 140 may include at least one of molybdenum (Mo), palladium (Pd), ruthenium (Ru), platinum (Pt), titanium nitride (TiN), tungsten nitride (WN), tantalum nitride (TaN), iridium (Ir), tantalum carbide (TaC), ruthenium nitride (RuN), titanium aluminum (TiAl), tantalum aluminum carbide (TaAlC), titanium aluminum nitride (TiAlN), molybdenum nitride (MoN), and/or mixture thereof. For example, the work-function control layer 140 may be composed of two layers, which are sequentially formed of titanium nitride (TiN) and tantalum nitride (TaN).

According to some embodiments of the inventive concepts, the work-function control layer 140 may be formed along the sidewall of the gate spacer 160.

The gate metal 150 may be formed on the work-function control layer 140. The gate metal 150 may include at least one of tungsten (W), aluminum (Al), and/or mixture thereof.

The gate spacer 160 may be formed on at least one sidewall of the gate structure TR. The gate spacer 160 may include at least one of silicon nitride (SiN), silicon oxynitride (SiON), and/or mixture thereof. The gate spacer 160 may have a shape of a round type, an I-type, or a L-type.

A source/drain region may be formed in the first and second active fins F1 and F2 which are adjacent sidewalls of the gate structure TR. The source/drain region may be separated from the gate structure TR by the gate spacer 160.

The first epitaxial layer 210 may be formed on the first active fin F1. The first epitaxial layer 210 may fill a first recess region R1 which is formed in a portion of the first active fin F1. The first epitaxial layer 210 may be formed by a selective-epitaxial-growth (SEG) process.

In a PMOS region of a fin-type field effect transistor (FinFET), the first epitaxial layer 210 may include a material which may induce a compressive stress in a channel region of the FinFET. Therefore, the first epitaxial layer 210 may be formed a material having a lattice constant greater than that of the substrate 100. For example, if the substrate 100 is a silicon (Si) substrate, the first epitaxial layer 210 may comprise silicon germanium (SiGe).

The second epitaxial layer 220 may be formed on the second active fin F1. The second epitaxial layer 220 may fill a second recess region R2 which is formed in a portion of the second active fin F2. The second epitaxial layer 220 may be formed by a selective-epitaxial-growth (SEG) process. The second epitaxial layer 220 may also include a material which may induce a compressive stress in a channel region of the FinFET.

The first and second epitaxial layers 210 and 220 may be formed simultaneously, or may be formed by separate processes, respectively.

If the first and second epitaxial layers 210 and 220 are formed by using a SEG process, upper surfaces of the first and second epitaxial layers 210 and 220 may have <100> plane orientation by the structural characteristics of the first and second active fins F1 and F2. Therefore, the first and second epitaxial layers 210 and 220 may have a diamond shape, respectively.

If a capping layer having a thin thickness is formed on the first and second epitaxial layers 210 and 220, it should be difficult to connect the first and second epitaxial layers 210 and 220 each other. Therefore, a source/drain contact which will be formed at the following step may not have enough bottom area and contact resistance of the source/drain contact may be increased.

If the capping layer having a relatively thick thickness is formed on the first and second epitaxial layers 210 and 220, upper surfaces of the first and second epitaxial layers 210 and 220 may have uneven surfaces even though they may be merged. Therefore, a silicide layer which will be formed at the following step may be unstably formed on the first and second epitaxial layers 210 and 220.

In addition, if the first and second epitaxial layers 210 and 220 are grown to an extent that they may merge, the upper surfaces of the first and second epitaxial layers 210 and 220 may also have uneven surfaces because the first and the second active fins F1 and F2 may have various pitch sizes between them.

Therefore, some embodiments of the inventive concepts provide methods of forming a bridge layer 300. The bridge layer 300 may be formed between the first and second active fins F1 and F2. A third epitaxial layer 230 may be formed on the bridge layer 300.

The upper surfaces of the first and second epitaxial layers 210 and 220 may have an even surface by forming the bridge layer 300 and the third epitaxial layer 230. Therefore, a silicide layer may be uniformly formed on the first and second epitaxial layers 210 and 220 and on the third epitaxial layer 230. Furthermore, the bottom surface of the source/drain contact may have enough area and the contact resistance of the source/drain contact may be reduced.

A capping layer 400 may be formed on the first and second epitaxial layers 210 and 220 before forming the bridge layer 300.

The third epitaxial layer 230 may be formed to fill the space between the first and second epitaxial layers 210 and 220 by using a SEG process.

The third epitaxial layer 230 may be formed from the surfaces of the bridge layer 300 and the first and second epitaxial layers 210 and 220. The upper surface of the third epitaxial layer 230 may have a flat surface by filling the space between the first and second epitaxial layers 210 and 220 and by performing a planarization process, for example, a chemical mechanical polishing (CMP) process. Therefore, the first and second epitaxial layers 210 and 220 may be merged uniformly and the upper surfaces of the first through the third epitaxial layers 210, 220, and 230 may have substantially the same plane.

The bridge layer 300 may have a different germanium (Ge) concentration from those of the first through the third epitaxial layers 210, 220, and 230. The bridge layer 300 may comprise a p-type impurity, e.g., boron (B). The first through the third epitaxial layers 201, 220, and 230 may comprise germanium (Ge).

Hereinafter, a description for a semiconductor device according to some embodiments of the inventive concepts will be described.

Figure 4:
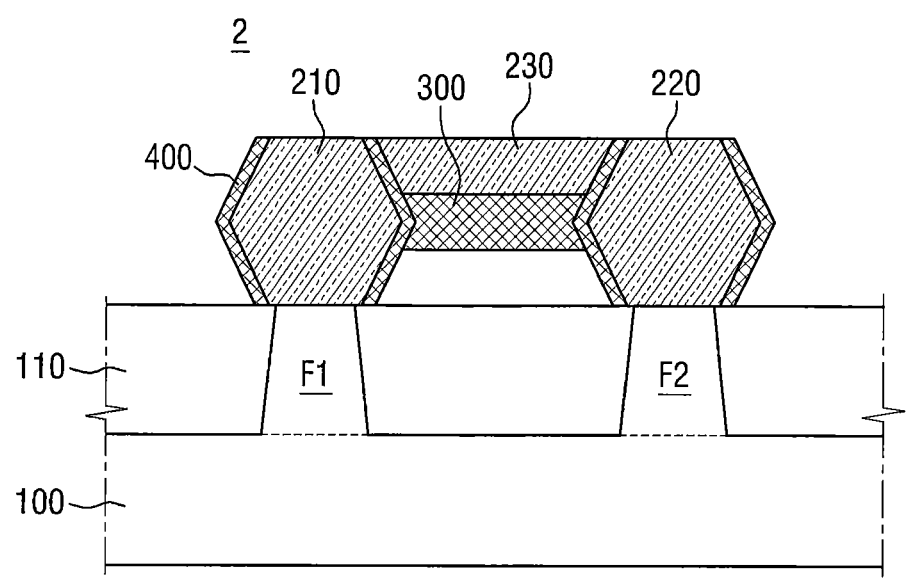
FIG. 4 is a cross-sectional view illustrating a semiconductor device according to some embodiments of the inventive concepts.

FIG. 4 is a cross-sectional view illustrating a semiconductor device according to some embodiments of the inventive concepts. For convenience of explanation, some of descriptions which are substantially the same description corresponding to embodiments of the inventive concepts described above will be omitted.

Referring to FIG. 4, the semiconductor device 2 according to some embodiments may include a capping layer 400 formed at between the first epitaxial layer 210 and the third epitaxial layer 230 and between the second epitaxial layer 220 and the third epitaxial layer 230, respectively.

The capping layer 400 may cover outer surfaces of the first and second epitaxial layers 210 and 220. The capping layer 400 may be formed on the first and second epitaxial layers 210 and 220 by using an epitaxial process. The capping layer 400 may be formed using different methods including, for example, atomic layer deposition (ALD), chemical vapor deposition (CVD), plasma enhanced chemical vapor deposition (PECVD), and/or low pressure chemical vapor deposition (LPCVD).

Some embodiments provide that the bridge layer 300 and the capping layer 400 may be composed of substantially the same material. The bridge layer 300 and the capping layer 400 may be formed simultaneously and may include boron (B). The boron concentration of the capping layer 400 may be equal to or less than that of the bridge layer 300. The boron concentration of the bridge layer 300 may be greater than 2.0E19 atoms/cc.

Figure 5:
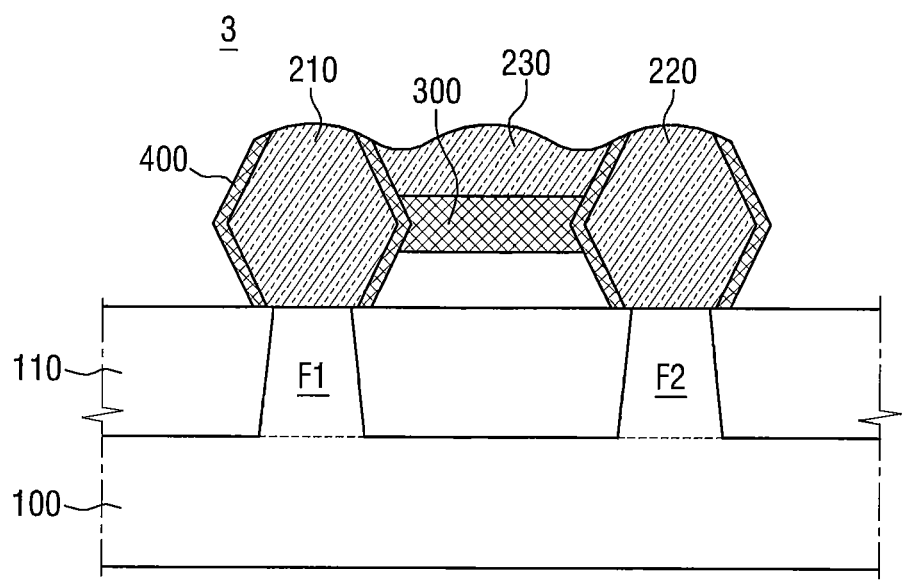
FIG. 5 is a cross-sectional view illustrating a semiconductor device according to some embodiments of the inventive concepts.

FIG. 5 is a cross-sectional view illustrating a semiconductor device according to some embodiments of the inventive concepts. For convenience of explanation, some of descriptions which are substantially the same description corresponding to the embodiments of the inventive concepts described above will be omitted.

Referring to FIG. 5, the semiconductor device 3 according to some embodiments may include a first through a third epitaxial layer 210, 220, and 230 which has uneven upper surface, respectively. If the upper surfaces of the first through the third epitaxial layer 210, 220, and 230 are uneven, contact surface between the contact and the first through the third epitaxial layer 210, 220, and 230 may be increased and the contact resistance thereof may be deceased.

Upper portions of the first through the third epitaxial layers 210, 220, and 230 may be partially removed by using a dry etching process or a wet etching process. At this moment, the upper surfaces of the first through the third epitaxial layers 210, 220, and 230 may have uneven surfaces as shown in FIG. 5.

Figure 6:
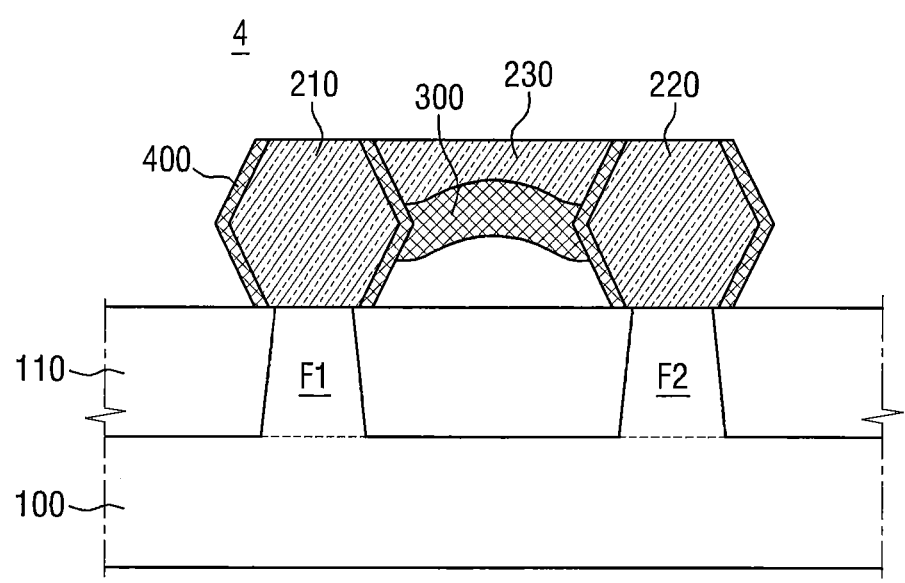
FIG. 6 is a cross-sectional view illustrating a semiconductor device according to some embodiments of the inventive concepts.

FIG. 6 is a cross-sectional view illustrating a semiconductor device according to some embodiments of the inventive concepts.

Referring to FIG. 6, the semiconductor device 4 according to some embodiments may include a bridge layer 300 having an uneven upper surface. According to the shape of the upper surface of the bridge layer 300, the third epitaxial layer 230 may be formed without any void. If any void is formed in the third epitaxial layer 230, reliability of the semiconductor device may be degraded.

Figure 7:
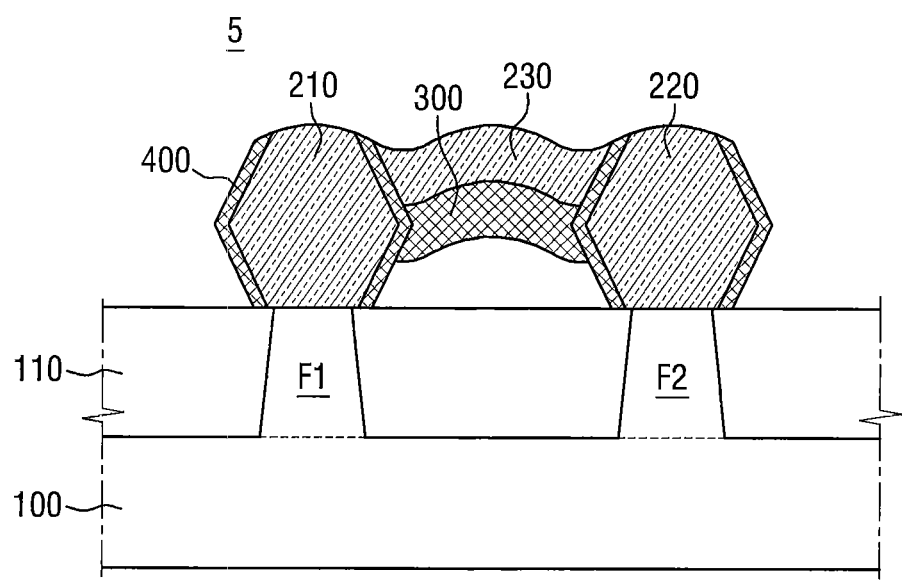
FIG. 7 is a cross-sectional view illustrating a semiconductor device according to some embodiments of the inventive concepts.

FIG. 7 is a cross-sectional view illustrating a semiconductor device according to some embodiments of the inventive concepts. For convenience of explanation, some of descriptions which are substantially the same description corresponding to some embodiments of the inventive concepts described above will be omitted.

Referring to FIG. 7, the semiconductor device 5 according to some embodiments may include a bridge layer 300 having an uneven upper surface. Additionally, the upper surfaces of the first through the third epitaxial layers 210, 220, and 230 may have uneven upper surfaces, respectively.

Figure 8:
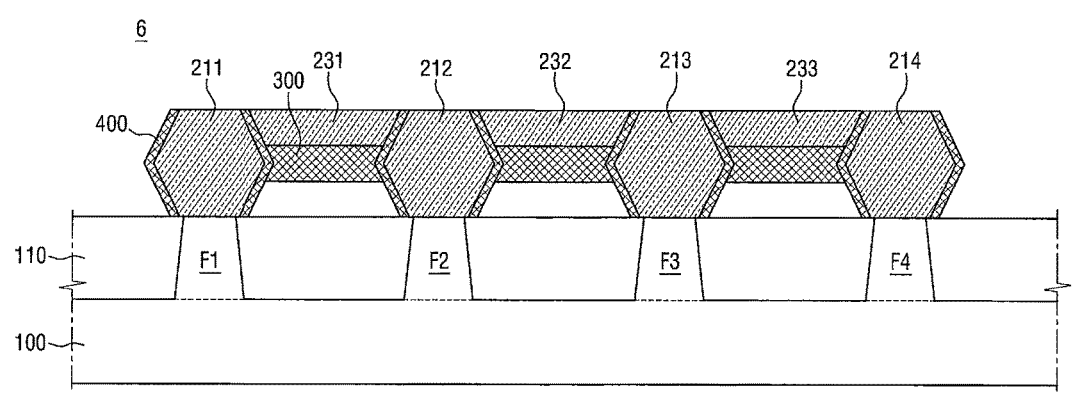
FIG. 8 is a cross-sectional view illustrating a semiconductor device according to some embodiments of the inventive concepts.

FIG. 8 is a cross-sectional view illustrating a semiconductor device according to some embodiments of the inventive concepts.

Referring to FIG. 8, the semiconductor device 6 according to some embodiments may include four epitaxial layers 211, 212, 213, and 214 formed on four active fins F1, F2, F3, and F4, respectively. However, the number of epitaxial layers and fins shall not be restricted or limited thereto. The four epitaxial layers 211, 212, 213, and 214 may be merged by a bridge layer 300. Additional epitaxial layers 231, 232, and 233 may be formed on the bridge layer 300.

Upper surfaces of the epitaxial layers 211, 212, 213, 214, 231, 232, and 233 may have even surfaces.

Figure 9:
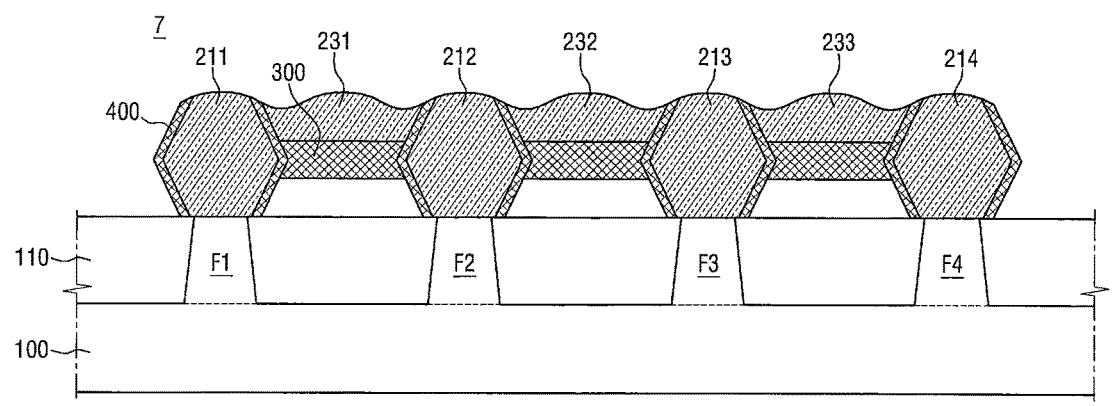
FIG. 9 is a cross-sectional view illustrating a semiconductor device according to some embodiments of the inventive concepts.

FIG. 9 is a cross-sectional view illustrating a semiconductor device according to some embodiments of the inventive concepts. For convenience of explanation, some of descriptions which are substantially the same description corresponding to some embodiments of the inventive concepts described above will be omitted.

Referring to FIG. 9, the semiconductor device 7 according to some embodiments may include epitaxial layers 211, 212, 213, 214, 231, 232, and 233 having uneven upper surfaces.

Figure 10:
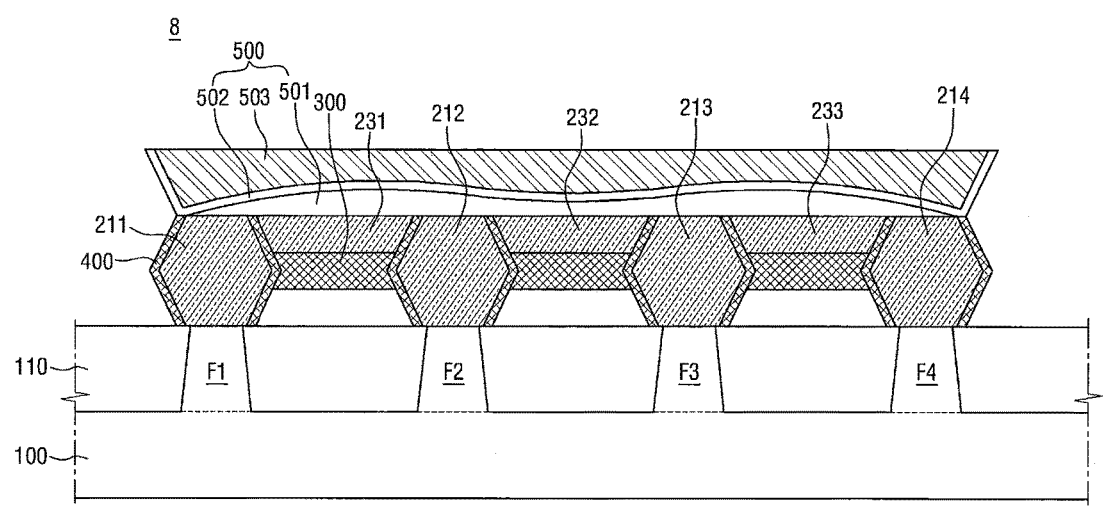
FIG. 10 is a cross-sectional view illustrating a semiconductor device according to some embodiments of the inventive concepts.

FIG. 10 is a cross-sectional view illustrating a semiconductor device according to some embodiments of the inventive concepts. For convenience of explanation, some of descriptions which are substantially the same description corresponding to some embodiment of the inventive concepts described above will be omitted.

Referring to FIG. 10, the semiconductor device 8 according to some embodiments may include a contact 500 formed on epitaxial layers 211, 212, 213, 214, 231, 232, and 233 having even upper surfaces. The contact 500 may comprise a silicide layer 501, a barrier layer 502, and a metal layer 503.

Figure 11:
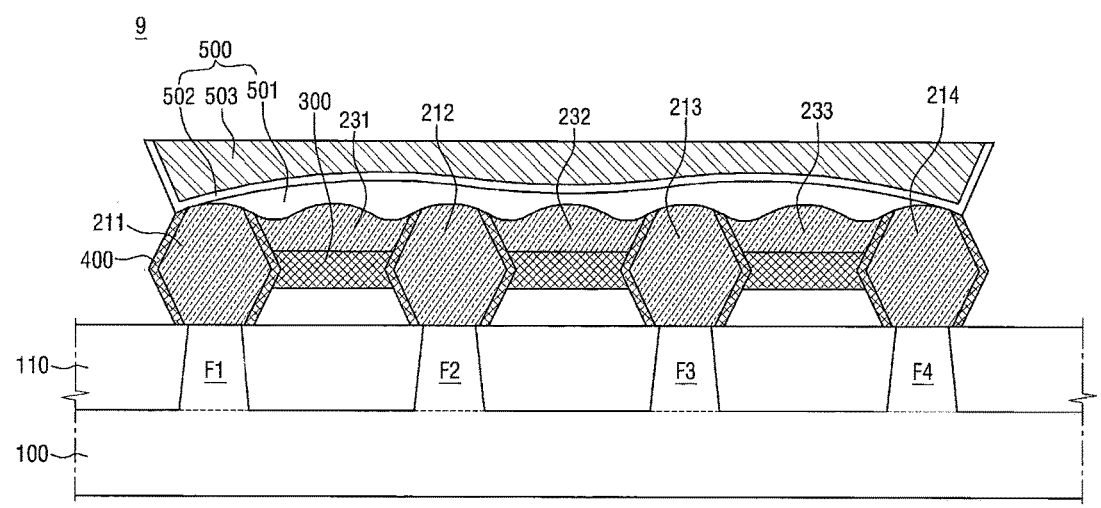
FIG. 11 is a cross-sectional view illustrating a semiconductor device according to some embodiments of the inventive concepts.

FIG. 11 is a cross-sectional view illustrating a semiconductor device according to some embodiments of the inventive concepts. For convenience of explanation, some of descriptions which are substantially the same description corresponding to some embodiments of the inventive concepts described above will be omitted.

Referring to FIG. 11, the semiconductor device 9 according to some embodiments may include a contact 500 formed on epitaxial layers 211, 212, 213, 214, 231, 232, and 233 having uneven upper surfaces. If the upper surfaces of epitaxial layers 211, 212, 213, 214, 231, 232, and 233 are uneven, contact surface between the contact 500 and the epitaxial layers 211, 212, 213, 214, 231, 232, and 233 may be increased and the contact resistance thereof may be deceased.

Figure 12:
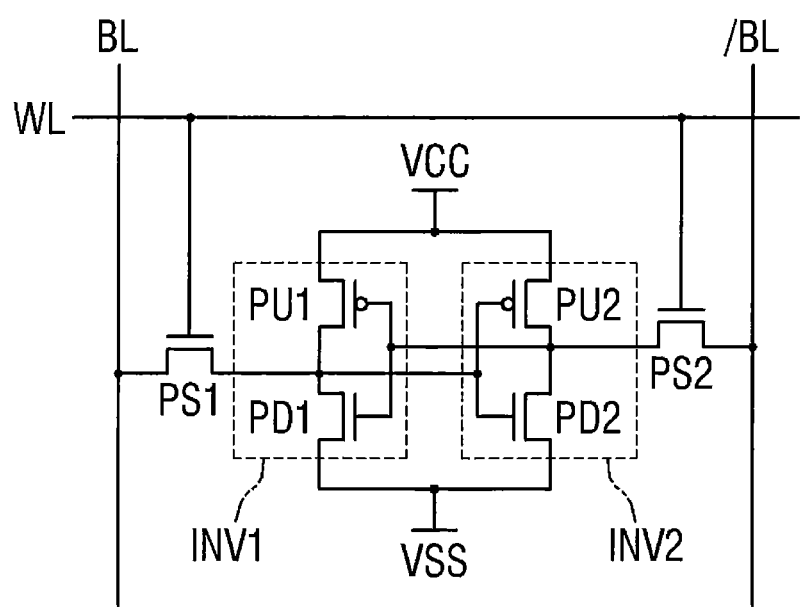
FIGS. 12 through 14 are a circuit diagram and layouts illustrating a semiconductor device according to some embodiments of the inventive concepts.
Figure 13:
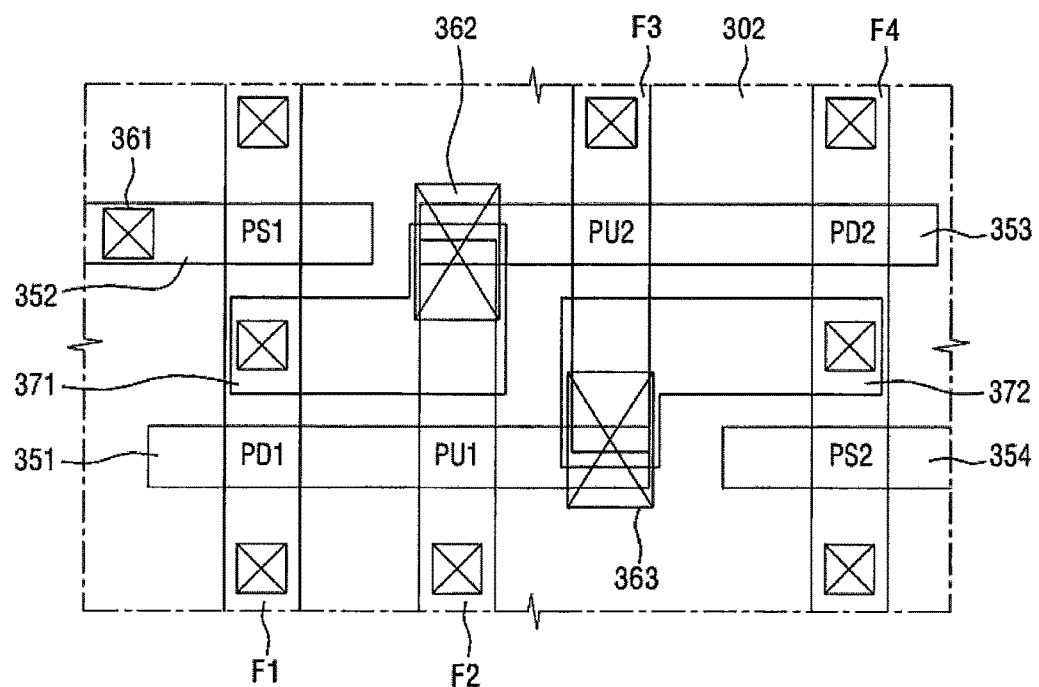
Figure 14:
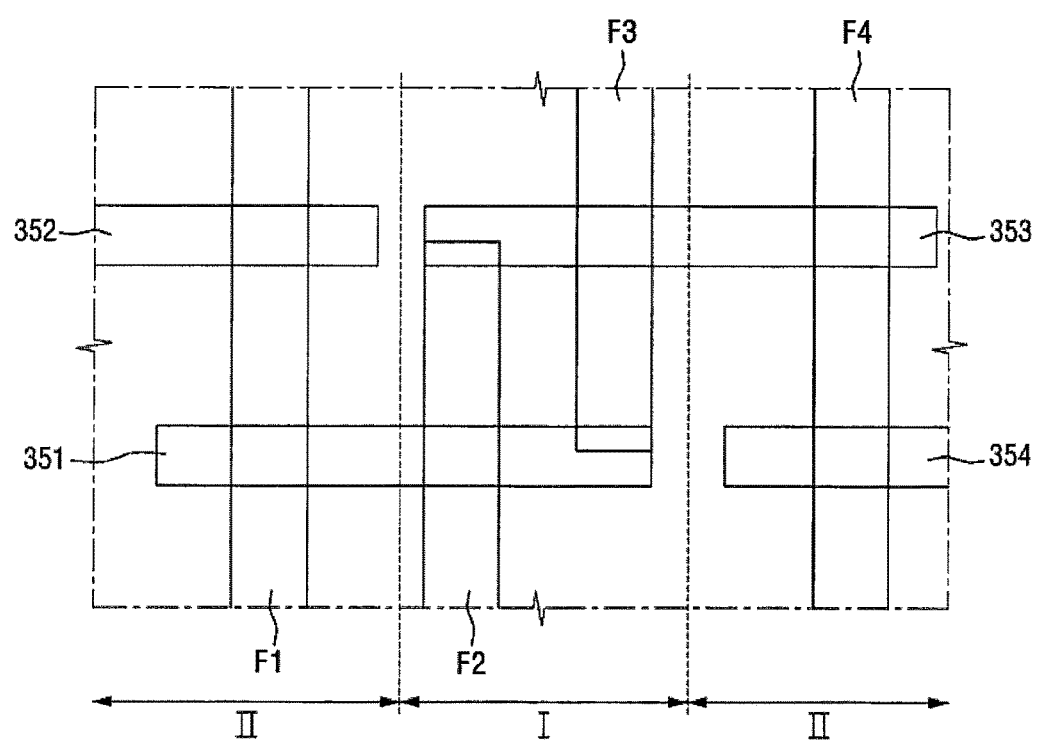

FIG. 12 is a circuit diagram illustrating a semiconductor device according to some embodiments of the inventive concepts. FIG. 13 is an equivalent layout of the circuit diagram shown in FIG. 12, and FIG. 14 is a plan view illustrating just a plurality of fins and gate structures shown in FIG. 13. The semiconductor devices according to the several example embodiments of the inventive concepts may be applied to logic devices and/or Static Random Access Memory (SRAM) devices having fin-type field effect transistors. FIGS. 12 through 14 are a circuit diagram and layouts illustrating a SRAM device.

Referring to FIG. 12, the semiconductor device according to some embodiments of the inventive concepts may include a SRAM device having a first inverter INV1 and a second inverter INV2 which are formed between a power supply node VCC and a ground node VSS. The first inverter INV1, having an input node and an output node, may have a first pull-up transistor PU1 and a first pull-down transistor PD1. The second inverter INV2, having an input node and an output node, may have a second pull-up transistor PU2 and a second pull-down transistor PD2. The input node of the first inverter INV1 may be connected to a source/drain region of a second pass transistor PS2 as well as to the output node of the second inverter INV2. The input node of the second inverter INV2 may be connected to a source/drain region of a first pass transistor PS1 as well as to the output node of the first inverter INV1. Gate electrodes of the first and second pass transistors may be connected to a word line WL. A bit line BL may be connected to a source/drain region of the first pass transistor PS1. A bit line bar/BL may be connected to a source/drain region of the second pass transistor PS2. The first and second pull-up transistors PU1 and PU2 may be PMOS transistors. The first and second pull-down transistors PD1 and PD2 and the first and second pass transistors PS1 and PS2 may be NMOS transistors. The semiconductor device may include at least one fin-type field effect transistor according to some embodiments of the present inventive concepts.

Referring to FIGS. 13 and 14, a first through fourth active fins F1, F2, F3, and F4 may be extended in a first direction and spaced aprt from one another in a second direction that is different from the first direction. The lengths of the second and third active fins F2 and F3 may be less than those of the first and fourth active fins F1 and F4.

A first gate structure 351 may cross over the first and second active fins F1 and F2 to form the first and second pull-down transistor PD1 and the first pull-up transistor PU1, respectively. A second gate structure 352 may cross over the first active fin F1 to form the first pass transistor PS1. The first gate structure 351 and the second gate structure 352 may be parallel to and apart from each other. A third gate structure 353 may cross over the third and fourth active fins F3 and F4 to form the second pull-down transistor PD2 and the second pull-up transistor PU2, respectively. A fourth gate structure 354 may cross over the fourth active region F4 to form the second pass transistor PS2. The third gate structure 353 and the fourth gate structure 354 may be parallel to and apart from each other.

A contact hole 361 may be formed on the gate structure of the first and second pass transistors PS1 and PS2. Additionally, other contact holes may be formed on the source/drain regions of the transistors mentioned above.

A first shared contact 362 may be formed on a portion of the second active fin F2. The first shared contact 362 may connect the source/drain of the first pull-up transistor PU1 to the gate structures of the second pull-up transistor PU2 and the second pull-down transistor PD2. A first interconnection line 371 may connect the first shared contact 362 to the source/drain regions of the first pull-up transistor PD1 and the first pass transistor PS1.

A second shared contact 363 may be formed on a portion of the third active fin F3. The second shared contact 363 may connect the source/drain of the second pull-up transistor PU2 to the gate structures of the first pull-up transistor PU1 and the first pull-down transistor PD1. A second interconnection line 372 may connect the second shared contact 363 to the source/drain regions of the second pull-up transistor PD2 and the second pass transistor PS2.

Figure 15:
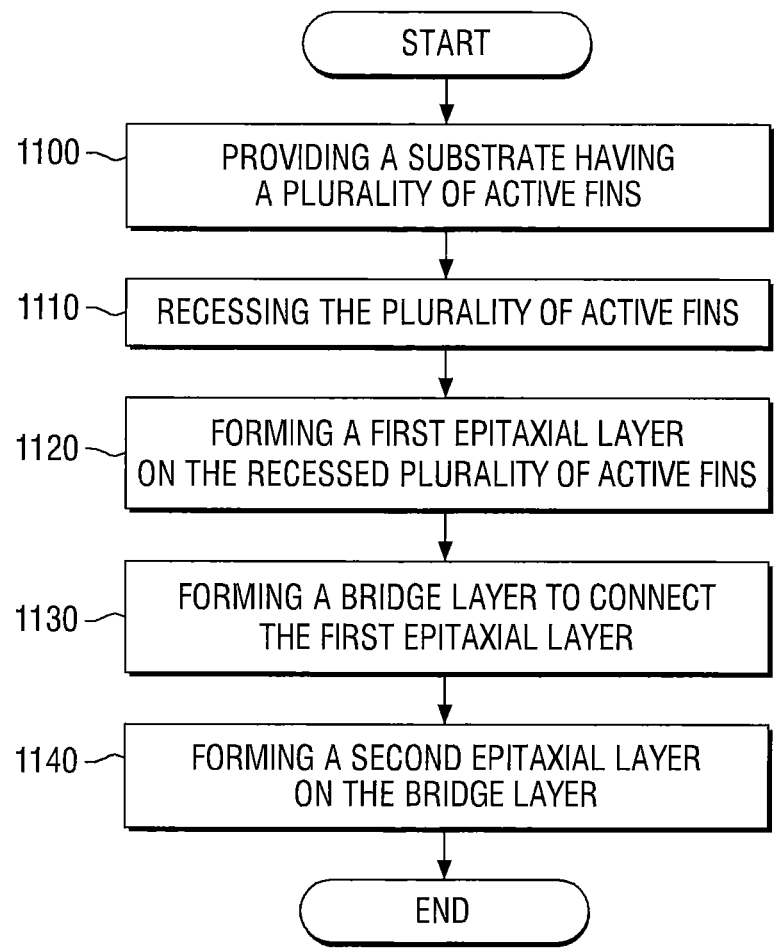
FIG. 15 is a flow chart illustrating methods of fabricating a semiconductor device according to some embodiments of the inventive concepts.
Figure 16:
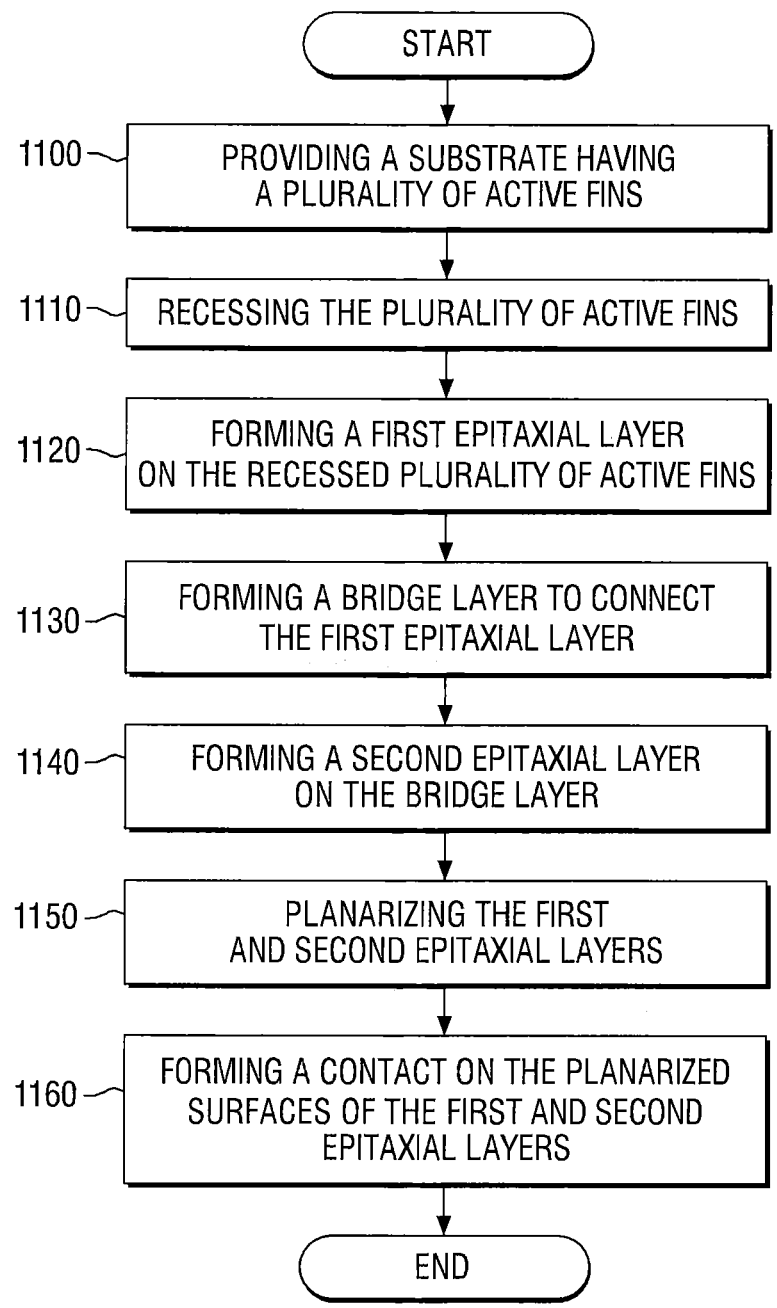
FIG. 16 is a flow chart illustrating methods of fabricating a semiconductor device according to some embodiments of the inventive concepts.

FIG. 15 is a flow chart illustrating methods of fabricating a semiconductor device according to some embodiments of the inventive concepts. FIG. 16 is a flow chart illustrating methods of fabricating a semiconductor device according to some embodiments of the inventive concepts. FIGS. 17 through 24 are cross-sectional views illustrating methods of fabricating a semiconductor device according to some embodiments of the inventive concepts.

Figure 17:
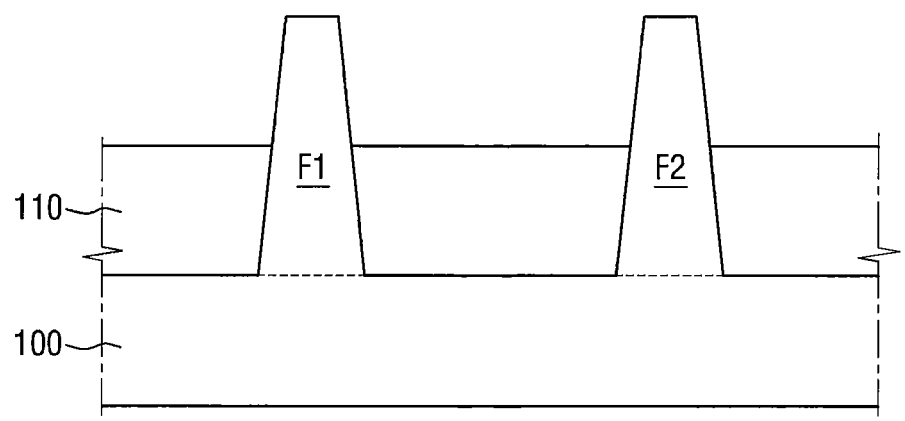
FIGS. 17 through 24 are cross-sectional views illustrating methods of fabricating a semiconductor device according to some embodiments of the inventive concepts.

Referring to FIGS. 15 and 17, a substrate 100 having a plurality of active fins F1 and F2 may be provided (block 1100).

The plurality of active fins F1 and F2 may be formed to protrude from the substrate 100. A device isolation region 110 may be formed on the substrate 100 and may cover a lower portion of sidewalls of the plurality of active fins F1 and F2.

Figure 18:
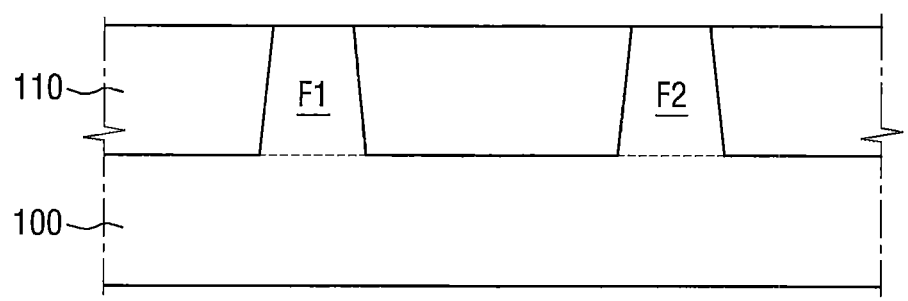

Referring to FIGS. 15 and 18, the plurality of active fins F1 and F2 may be recessed (block 1110). Upper surfaces of the plurality of active fins F1 and F2 may have substantially the same level with the upper surface of the device isolation region 110, however, it shall not be restricted or limited thereto.

Figure 19:
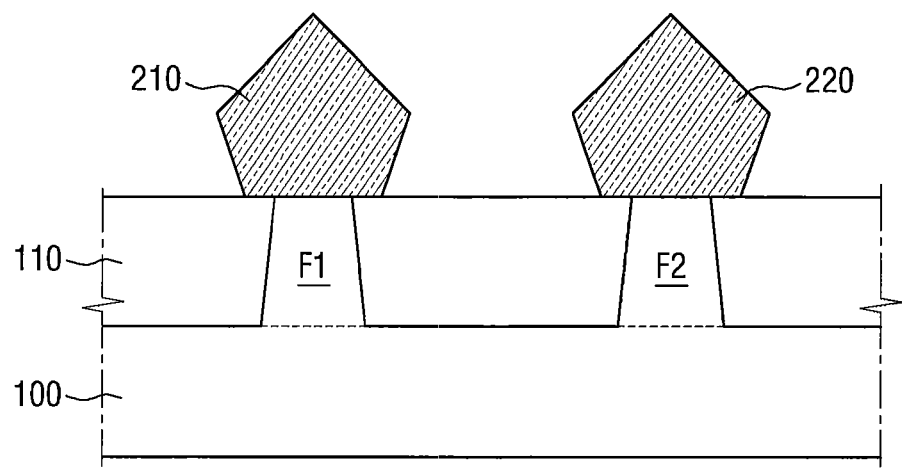

Referring to FIGS. 15 and 19, a first epitaxial layer 210 and a second epitaxial layer 220 may be formed on the recessed plurality of active fins F1 and F2, respectively (block 1120). The first and second epitaxial layers 210 and 220 may be formed by using a plurality of epitaxial processes. For example, the first and second epitaxial layers 210 and 220 may be formed by a first epitaxial process and a second epitaxial process. The first epitaxial process may be performed at a high pressure, e.g., about form 50 torr to 400 torr, with germanium (Ge). The second epitaxial process may be performed at a low pressure, e.g., about form 3 torr to 50 torr, with a p-type impurity, e.g., boron (B). The first and second epitaxial processes may be performed in-situ.

Figure 20:
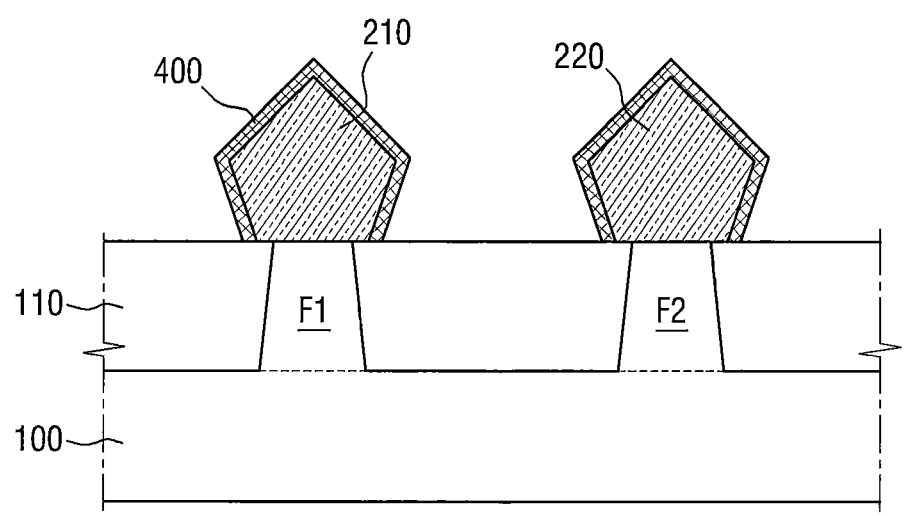

Referring to FIG. 20, a capping layer 400 may be formed on the first and second epitaxial layers 210 and 220.

The capping layer 400 may be formed by using an atomic layer deposition (ALD) process, a chemical vapor deposition (CVD) process, a plasma enhanced chemical vapor deposition (PECVD) process, and/or a low pressure chemical vapor deposition (LPCVD) process.

Figure 21:
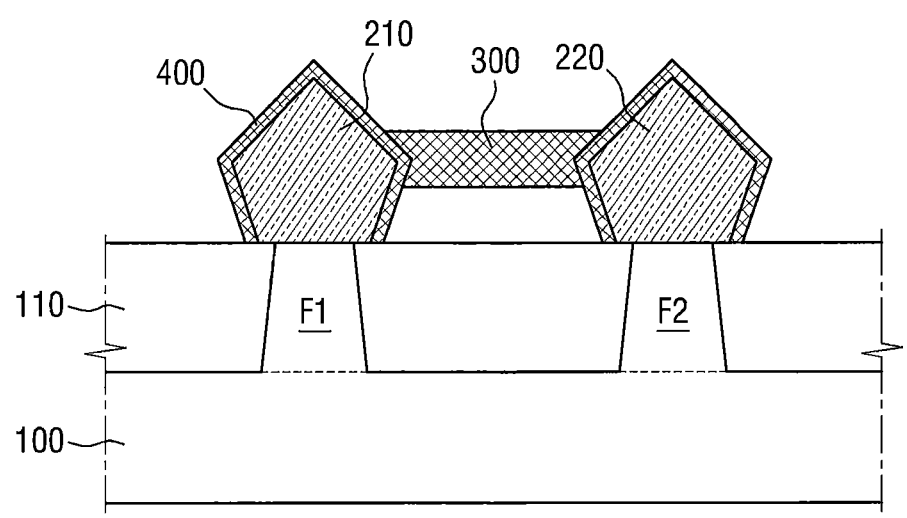

Referring to FIGS. 15 and 21, a bridge layer 300 may be formed to connect the first epitaxial layer 210 to the second epitaxial layer 220 (block 1130).

The bride layer 300 may be a silicon (Si) layer having a p-type impurity, e.g., boron (B). The concentration of boron (B) may be higher than 2.0E19 atoms/cc. If the bride layer 300 is formed at a lower pressure, e.g., about from 3 torr to 50 torr, growth rate of the bridge layer 300 may be greater than at a relatively higher pressure.

The bridge layer 300 and the capping layer 400 may be composed of substantially the same material. For example, the bridge layer 300 and the capping layer 400 may be a silicon (Si) layer having a p-type impurity, e.g., boron (B). The bridge layer 300 may have a first concentration of boron (B) and the capping layer 400 may have a second concentration of boron (B). The second concentration of boron (B) may be equal to or less than the first concentration boron (B).

Figure 22:
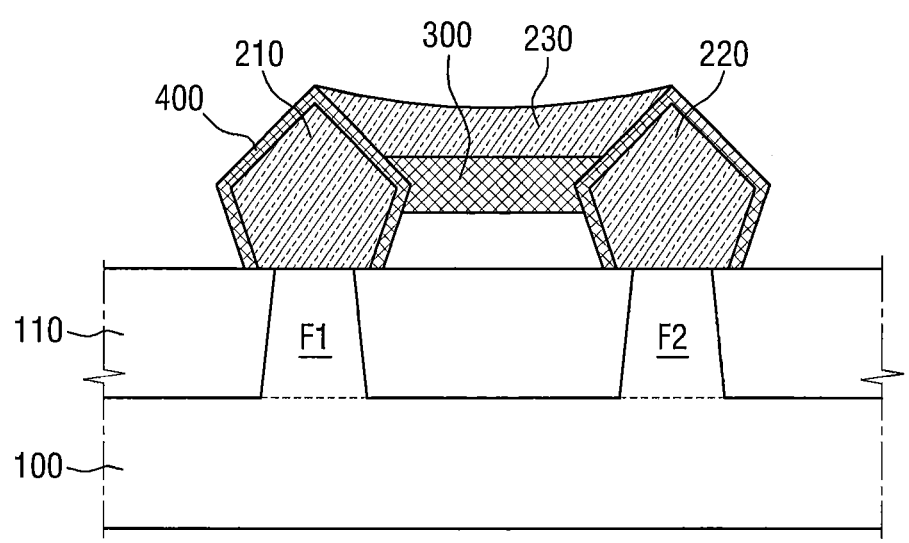

Referring to FIGS. 15 and 22, a third epitaxial layer 230 may be formed on the bridge layer 300 (block 1140).

The third epitaxial layer 230 may be grown using a SEG process from the surfaces of the bridge layer 300 and the capping layer 400 formed on the first and second epitaxial layers 210 and 220. The third epitaxial layer 230 may be formed to fill the space between the first and second epitaxial layers 210 and 220.

Figure 23:
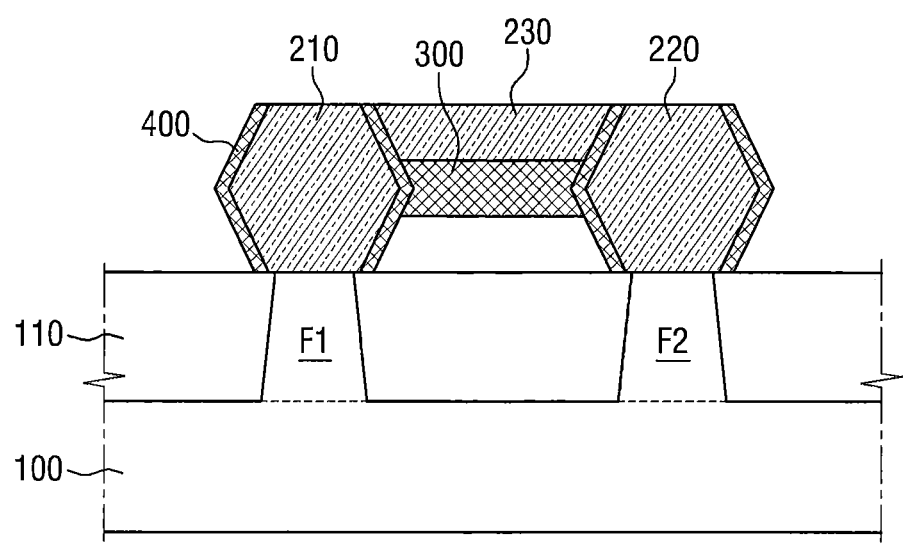

Referring to FIGS. 15 and 23, upper surfaces of the first through third epitaxial layers 210, 220, and 230 may be planarized (block 1150).

Specifically, the first through third epitaxial layers 210, 220, and 230 may have a flat surface by performing a planarization process, for example, a chemical mechanical polishing (CMP) process.

Figure 24:
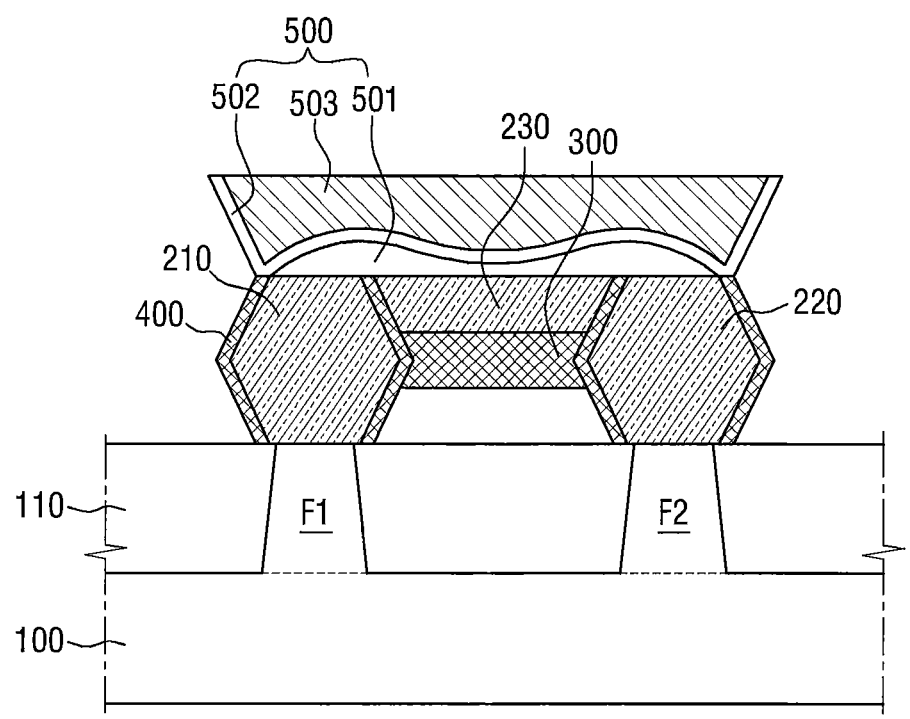

Referring to FIGS. 15 and 24, a contact 500 may be formed on the planarized surfaces of the first through third epitaxial layers 210, 220, and 230 (block 1160). The contact 500 may simultaneously contact the planarized upper surfaces of the first through third epitaxial layers 210, 220, and 230.

Figure 25:
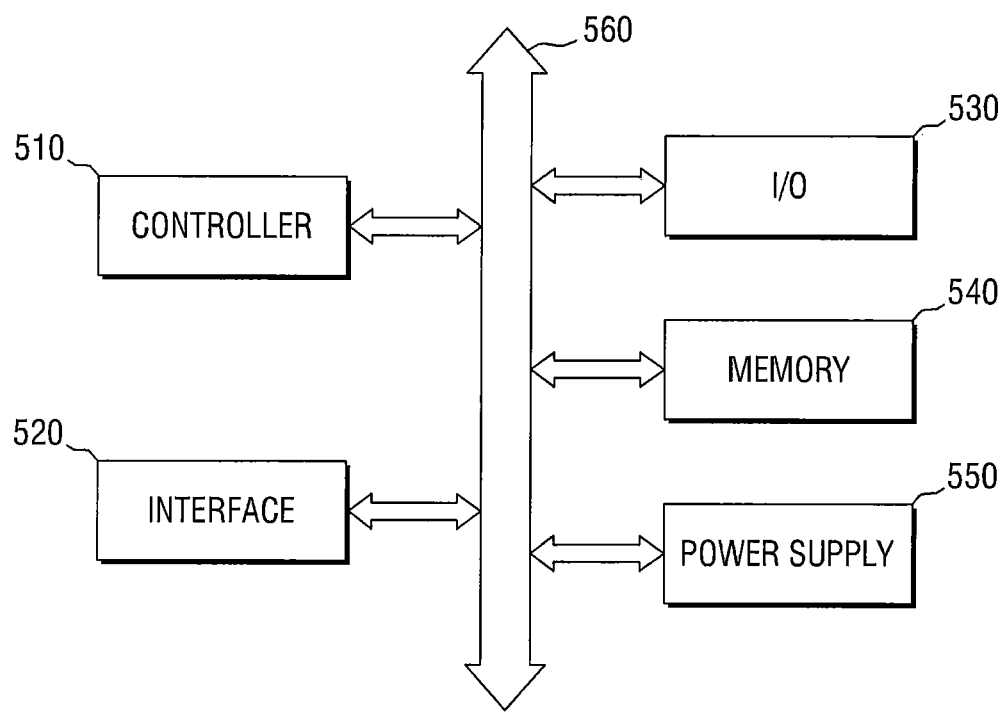
FIG. 25 is a block diagram of an electronic system including a semiconductor device according to some embodiments of the inventive concepts.

FIG. 25 is a block diagram of an electronic system including a semiconductor device according to some embodiments of the inventive concepts.

Referring to FIG. 25, an electronic system may include a controller 510, an interface 520, an input/output device 530, a memory device 540, a power supply 550, and a bus 560. The controller 510, the interface 520, the input/output device 530, the memory device 540, the power supply 550 may communicate with each other through the bus 560. The bus 560 may correspond to a path that data can be moved to each other.

The controller 510 may comprise a microprocessor, a digital signal processor, a microcontroller, or a similar device that can control an executive program. The interface 520 may transfer data to or from a communication network. The interface 520 may have various forms of wired or wireless, for example, an antenna or a wired or wireless transceiver. The input/output device 530 may comprise a keypad, a keyboard, or a display. The memory device 540 may not only save codes or data for executing the controller 510 but also save data executed by the controller 510. The memory device 540 may comprise a semiconductor device according to some embodiments of the inventive concepts. The power supply 550 may supply a voltage to all of the elements 510 through 540.

Figure 26:
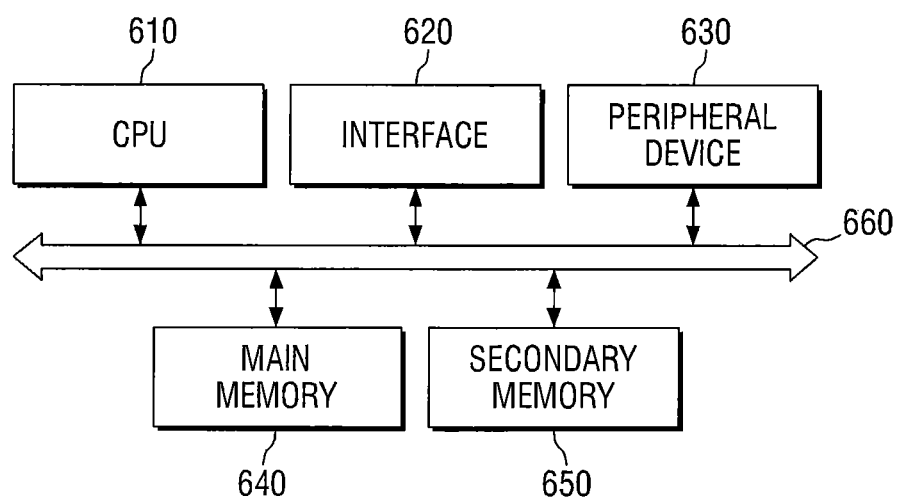
FIG. 26 is a block diagram of an electronic system including a semiconductor device according to some embodiments of the inventive concepts.

FIG. 26 is a block diagram of an electronic system including a semiconductor device according to some embodiments of the inventive concepts.

Referring to FIG. 26, the electronic system may comprise a central processing unit (CPU) 610, an interface 620, a peripheral device 630, a main memory 640, a secondary memory 650, and a bus 660.

The CPU 610, the interface 620, the peripheral device 630, the main memory 640, a secondary memory 650 may be electrically connected to each other through the bus 660. The bus 660 may correspond to a path that data can be moved to each other. The CPU 610 may comprise a controller and a computing device, and may execute programs to process data. The interface 620 may transfer the data to or from a communication network. The interface 620 may have various forms of wired or wireless, for example, an antenna or a wired or wireless transceiver. The peripheral device 630 may include a mouse, a keyboard and a display, and may input or output the data. The main memory device 640 may save a command or a data for executing programs but also communicate with the CPU 610. The main memory device 640 may comprise a semiconductor device according to some embodiments of the inventive concepts. The secondary memory device 650 may be nonvolatile memory device, for example, a magnetic tape, a magnetic disk, a hard disk, a solid state disk (SSD), and/or an optical disk. The secondary memory device 650 may save a command or a data for executing programs even when the power supply is interrupted.

The electronic system may be applied to a product that can transport information or data, e.g., a ultra mobile personal computer, a work station, a net-book, a PDA (personal digital assistant), a portable computer, a web tablet, a wireless phone, a mobile phone, a smart phone, an e-book, a portable multimedia player, a portable game device, a navigation system, a black box, a digital camera, a three dimensional television, a digital audio recorder, a digital audio player, a digital picture player, a digital video recorder, a digital video player, and/or a memory card.

The above-disclosed subject matter is to be considered illustrative and not restrictive, and the appended claims are intended to cover all such modifications, enhancements, and other embodiments, which fall within the true spirit and scope of the inventive concepts. Thus, the scope of the inventive concepts is to be determined by the broadest permissible interpretation of the following claims and their equivalents, and shall not be restricted or limited by the foregoing detailed description.

What is claimed is:

1. A semiconductor device comprising:
   a substrate;
   a first active fin on the substrate;
   a second active fin on the substrate, the second active fin being spaced apart from and substantially parallel to the first active fin;
   a third active fin on the substrate, the third active fin being spaced apart from and substantially parallel to the second active fin;
   an isolation layer on the substrate and on sidewalls of the first, second, and third active fins;
   a first epitaxial layer on the first active fin;
   a second epitaxial layer on the second active fin;
   a third epitaxial layer on the third active fin;
   a first bridge layer between the first epitaxial layer and the second epitaxial layer; and
   a second bridge layer between the second epitaxial layer and the third epitaxial layer,
   wherein the first bridge layer and the second bridge layer are spaced apart from an upper surface of the isolation layer.

2. The semiconductor device of claim 1, further comprising:
   a first capping layer on the first epitaxial layer;
   a second capping layer on the second epitaxial layer; and
   a third capping layer on the third epitaxial layer.

3. The semiconductor device of claim 1, wherein the first epitaxial layer is diamond-shaped.

4. The semiconductor device of claim 1,
   wherein the first epitaxial layer comprises a sidewall including a tip, and
   wherein the sidewall of the first epitaxial layer is convexly curved at the tip.

5. The semiconductor device of claim 1, wherein each of the first epitaxial layer, the second epitaxial layer, and the third epitaxial layer includes germanium (Ge).

6. The semiconductor device of claim 5, wherein each of the first bridge layer and the second bridge layer includes germanium (Ge).

7. The semiconductor device of claim 6,
   wherein a concentration of germanium (Ge) included in the first bridge layer is different from a concentration of germanium (Ge) included in the first epitaxial layer, and different from a concentration of germanium (Ge) included in the second epitaxial layer, and
   wherein a concentration of germanium (Ge) included in the second bridge layer is different from the concentration of germanium (Ge) included in the second epitaxial layer, and different from a concentration of germanium (Ge) included in the third epitaxial layer.

8. The semiconductor device of claim 1,
   wherein the first bridge layer includes a lower surface and an upper surface facing each other, and
   wherein the lower surface of the first bridge layer facing the upper surface of the isolation layer is non-planar.

9. The semiconductor device of claim 1, further comprising a contact on the first epitaxial layer and on the second epitaxial layer.

10. The semiconductor device of claim 9, wherein a bottom surface of the contact is uneven.

11. The semiconductor device of claim 10,
    wherein the first bridge layer includes a lower surface and an upper surface facing each other, and
    wherein the upper surface of the first bridge layer facing the bottom surface of the contact is non-planar.

12. The semiconductor device of claim 9, wherein the contact includes:
    a barrier layer; and
    a metal layer on the barrier layer.

13. The semiconductor device of claim 1, further comprising a space between the first bridge layer and the isolation layer, and between the second bridge layer and the isolation layer.

14. The semiconductor device of claim 1, wherein the first bridge layer has a plurality of layers.

15. A semiconductor device comprising:
    a substrate;
    a first active fin on the substrate;
    a second active fin on the substrate, the second active fin being spaced apart from and substantially parallel to the first active fin;
    a third active fin on the substrate, the third active fin being spaced apart from and substantially parallel to the second active fin;
    an isolation layer on the substrate and on sidewalls of the first, second, and third active fins;
    a first epitaxial layer on the first active fin;
    a second epitaxial layer on the second active fin;
    a third epitaxial layer on the third active fin;
    a first bridge layer between the first epitaxial layer and the second epitaxial layer; and
    a second bridge layer between the second epitaxial layer and the third epitaxial layer,
    wherein the first bridge layer and the second bridge layer are spaced apart from an upper surface of the isolation layer, and
    wherein at least one of a first surface of the first bridge layer and a second surface of the second bridge layer is curved.

16. The semiconductor device of the claim 15, wherein the at least one of the first surface of the first bridge layer and the second surface of the second bridge layer is convexly curved.

17. The semiconductor device of the claim 15, wherein the at least one of the first surface of the first bridge layer and the second surface of the second bridge layer is concavely curved.

18. A semiconductor device comprising:

a substrate;

a first active fin on the substrate;

a second active fin on the substrate, the second active fin being spaced apart from and substantially parallel to the first active fin;

a third active fin on the substrate, the third active fin being spaced apart from and substantially parallel to the second active fin;

an isolation layer on the substrate and on sidewalls of the first, second, and third active fins;

a semiconductor pattern on the first, second, and third active fins and including a first surface that is uneven; and a contact on the first surface of the semiconductor pattern, wherein the semiconductor pattern includes a first epitaxial layer on the first active fin, a second epitaxial layer on the second active fin, a third epitaxial layer on the third active fin, a first bridge layer between the first epitaxial layer and the second epitaxial layer, and a second bridge layer between the second epitaxial layer and the third epitaxial layer, and wherein the first bridge layer and the second bridge layer are spaced apart from an upper surface of the isolation layer.

19. The semiconductor device of claim 18, wherein a bottom surface of the contact facing the first surface of the semiconductor pattern is uneven.

20. The semiconductor device of claim 18, wherein the first surface of the semiconductor pattern on the first epitaxial layer, the second epitaxial layer, and the third epitaxial layer is convexly curved, and wherein the first surface of the semiconductor pattern on the upper surface of the isolation layer is concavely curved.

* * * * *